(12) United States Patent
Pan et al.

(10) Patent No.: US 11,145,370 B2
(45) Date of Patent: Oct. 12, 2021

(54) APPARATUSES AND METHODS FOR SEGMENTED SGS LINES

(71) Applicant: MICRON TECHNOLOGY, INC., Boise, ID (US)

(72) Inventors: Feng Pan, Fremont, CA (US); Jaekwan Park, Cupertino, CA (US); Ramin Ghodsi, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/065,655

(22) Filed: Oct. 8, 2020

(65) Prior Publication Data

US 2021/0166761 A1 Jun. 3, 2021

Related U.S. Application Data

(63) Continuation of application No. 16/457,611, filed on Jun. 28, 2019, now Pat. No. 10,803,945, which is a
(Continued)

(51) Int. Cl.
*G11C 16/04* (2006.01)
*G11C 16/26* (2006.01)
*G11C 8/12* (2006.01)
*G11C 16/08* (2006.01)
*G11C 16/10* (2006.01)
(Continued)

(52) U.S. Cl.
CPC ............ *G11C 16/0483* (2013.01); *G11C 8/12* (2013.01); *G11C 16/08* (2013.01); *G11C 16/10* (2013.01); *G11C 16/26* (2013.01); *G11C 11/5628* (2013.01); *G11C 11/5642* (2013.01); *G11C 16/04* (2013.01); *G11C 16/24* (2013.01)

(58) Field of Classification Search
CPC ..... G11C 16/0483; G11C 16/26; G11C 16/04; G11C 16/16; G11C 16/10; G11C 16/08; G11C 8/12
USPC ....................................................... 365/185
See application file for complete search history.

(56) References Cited

U.S. PATENT DOCUMENTS 6,031,764 A 2/2000 Imamiya et al.
7,778,086 B2 8/2010 Yu et al.
(Continued)

FOREIGN PATENT DOCUMENTS

JP 2012069606 A 4/2012
JP 2014186761 A 10/2014
(Continued)

OTHER PUBLICATIONS

CN Office Action dated Jul. 22, 2020 for CN Application No. 201580056789.5, pp. all.
(Continued)

*Primary Examiner* — Xiaochun L Chen
(74) *Attorney, Agent, or Firm* — Dorsey & Whitney LLP (57) ABSTRACT

Apparatuses and methods for segmented SGS lines are described. An example apparatus includes a plurality of memory subblocks, a plurality of first select gate control lines, each first select gate control line of the plurality of first select gate control lines configured to couple a memory subblock of the plurality of memory subblocks to a signal line, and a second select gate control line configured to couple the plurality of memory subblocks to a source line.

20 Claims, 5 Drawing Sheets

Related U.S. Application Data continuation of application No. 15/280,301, filed on Sep. 29, 2016, now Pat. No. 10,381,080, which is a continuation of application No. 14/518,807, filed on Oct. 20, 2014, now Pat. No. 9,460,792.

(51) Int. Cl.
  *G11C 16/24* (2006.01)
  *G11C 11/56* (2006.01)

(56) References Cited

U.S. PATENT DOCUMENTS

| | | |
|---|---|---|
| 8,670,285 B2 | 3/2014 | Dong et al. |
| 9,001,584 B2 | 4/2015 | Ha |
| 9,042,177 B2 | 5/2015 | Aritome |
| 9,136,007 B2 | 9/2015 | Shirakawa |
| 9,299,439 B2 | 3/2016 | Ghodsi |
| 9,460,792 B2 | 9/2016 | Pan et al. |
| 9,569,933 B2 | 2/2017 | Baker |
| 9,672,918 B2 | 6/2017 | Hashimoto |
| 10,134,478 B2 | 11/2018 | Pan et al. |
| 10,381,080 B2 | 8/2019 | Pan et al. |
| 10,803,945 B2 | 10/2020 | Pan et al. |
| 2005/0265076 A1 | 12/2005 | Forbes |
| 2006/0044872 A1 | 3/2006 | Nazarian |
| 2007/0263662 A1 | 11/2007 | Roohparvar |
| 2008/0181020 A1 | 7/2008 | Yu et al. |
| 2010/0074015 A1 | 3/2010 | Chandrasekhar et al. |
| 2011/0019495 A1 | 1/2011 | Scheuerlein et al. |
| 2012/0039130 A1 | 2/2012 | Yoon et al. |
| 2012/0069663 A1 | 3/2012 | Itagaki et al. |
| 2012/0250420 A1 | 10/2012 | Shirakawa et al. |
| 2012/0320678 A1 | 12/2012 | Maejima et al. |
| 2013/0058165 A1 | 3/2013 | Maejima et al. |
| 2013/0170299 A1 | 7/2013 | Yip |
| 2013/0258779 A1 | 10/2013 | Liu |
| 2013/0272069 A1 | 10/2013 | Rabkin et al. |
| 2014/0036590 A1 | 2/2014 | Feeley et al. |
| 2014/0040538 A1 | 2/2014 | Seo et al. |
| 2014/0063947 A1 | 3/2014 | Ghodsi |
| 2014/0063960 A1 | 3/2014 | Goda et al. |
| 2014/0071758 A1 | 3/2014 | Toshiba |
| 2014/0160850 A1 | 6/2014 | Liu |
| 2014/0211563 A1 | 7/2014 | Chang et al. |
| 2014/0241060 A1 | 8/2014 | Ha |
| 2014/0241092 A1 | 8/2014 | Ha |
| 2014/0286099 A1 | 9/2014 | Shirakawa |
| 2014/0328128 A1 | 11/2014 | Louie et al. |
| 2015/0023103 A1* | 1/2015 | Aritome ............... G11C 16/10 365/185.12 |
| 2016/0012915 A1 | 1/2016 | Magia et al. |
| 2016/0071593 A1 | 3/2016 | Hashimoto |
| 2016/0111160 A1 | 4/2016 | Pan et al. |
| 2016/0111167 A1 | 4/2016 | Pan et al. |
| 2017/0018309 A1 | 1/2017 | Pan et al. |
| 2017/0162269 A1 | 6/2017 | Pan |
| 2019/0074070 A1 | 3/2019 | Pan et al. |
| 2019/0325965 A1 | 10/2019 | Pan et al. |

FOREIGN PATENT DOCUMENTS

| | | |
|---|---|---|
| WO | 2013101459 A1 | 7/2013 |
| WO | 2016064579 A1 | 4/2016 |

OTHER PUBLICATIONS

English Translation of Notice of Preliminary Rejection dated Sep. 30, 2018 for Korean application No. 10-2017-7013339, pp. all.
English Translation of Third Office Action dated Sep. 25, 2018 for Taiwanese application No. 106116629, pp. all.
EP Office Action dated Mar. 12, 2020 for EP Application No. 15852706.9, 6 pgs.
Extended European Search Report received for EP Application No. 15852706.9, dated Apr. 12, 2018, pp. all.
First CN Office Action for CN Application No. 201580056789.5 dated Feb. 25, 2020 ; pp. all.
First Office Action dated Dec. 11, 2017 for Taiwanese Application No. 106116629, pp. all.
First Office Action for JP Application No. 2017-520905, dated Mar. 27, 2018, pp. all.
Notice of Rejection Ground for JP Application No. 2017-520905, dated Aug. 28, 2018, pp. all.
Second Office Action for TW Application No. 106116629, dated Apr. 16, 2018, pp. all.
Translation of Korean Office Action dated Apr. 24, 2019 for Appl. No. 10-2017-7013339, 1 pg.
U.S. Appl. No. 15/436,289, entitled "Apparatuses And Methods For Reducing Read Disturb", filed Feb. 17, 2017, pp. all.
U.S. Appl. No. 16/182,355 titied "Apparatuses and Methods for Reducing Read Disturb" filed Nov. 6, 2018, pp. all.
EP Office Action dated Mar. 21, 2019 for Appl No. 15852706.9, 7 pgs.
U.S. Appl. No. 16/457,611 titled "Apparatuses and Methods for Segmented SGS Lines", filed Jun. 28, 2019, pp. all.
First Office Action Received for TW Appl No. 104134252 dated Oct. 12, 2016; pp. all.
International Search Report and Written Opinion received for PCT/US2015/054412 dated Feb. 24, 2016; pp. all.
U.S. Appl. No. 15/280,301, entitled "Apparatuses And Methods For Segmented SGS Lines", filed Sep. 29, 2016 pp. all.
Micheloni, et al., "NAND Overview: From Memory to Systems", Inside NAND Flash Memories, Jul. 27, 2010, p. 19-53.

* cited by examiner

Fig. 4 ably obscuring the invention.
APPARATUSES AND METHODS FOR SEGMENTED SGS LINES

CROSS-REFERENCE TO RELATED APPLICATION

This application is a continuation of U.S. patent application Ser. No. 16/457,611 filed Jun. 28, 2019, which is a continuation of U.S. patent application Ser. No. 15/280,301 filed Sep. 29, 2016 and issued as U.S. Pat. No. 10,381,080 on Aug. 13, 2019 which is a continuation of U.S. patent application Ser. No. 14/518,807, filed Oct. 20, 2014 and issued as U.S. Pat. No. 9,460,792 on Oct. 4, 2016. The aforementioned applications, and issued patents, are incorporated by reference herein in their entirety and for all purposes.

BACKGROUND

Memory cell density, such as that of non-volatile memory, has been improved significantly in an effort to achieve greater storage capacity, while not significantly increasing cost or memory footprint. One widely adopted solution has been to implement memory cells in three-dimensions, for instance, using vertically oriented NAND strings.

Implementing memories in this manner has presented challenges, however. By way of example, as a result of three-dimensional implementation, block sizes have increased, and as a corollary, capacitive and resistive loads generated during operation have increased as well.

DETAILED DESCRIPTION

Apparatuses and methods for segmented SGS lines are described herein. Certain details are set forth below to provide a sufficient understanding of embodiments of the invention. However, it will be clear to one having skill in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
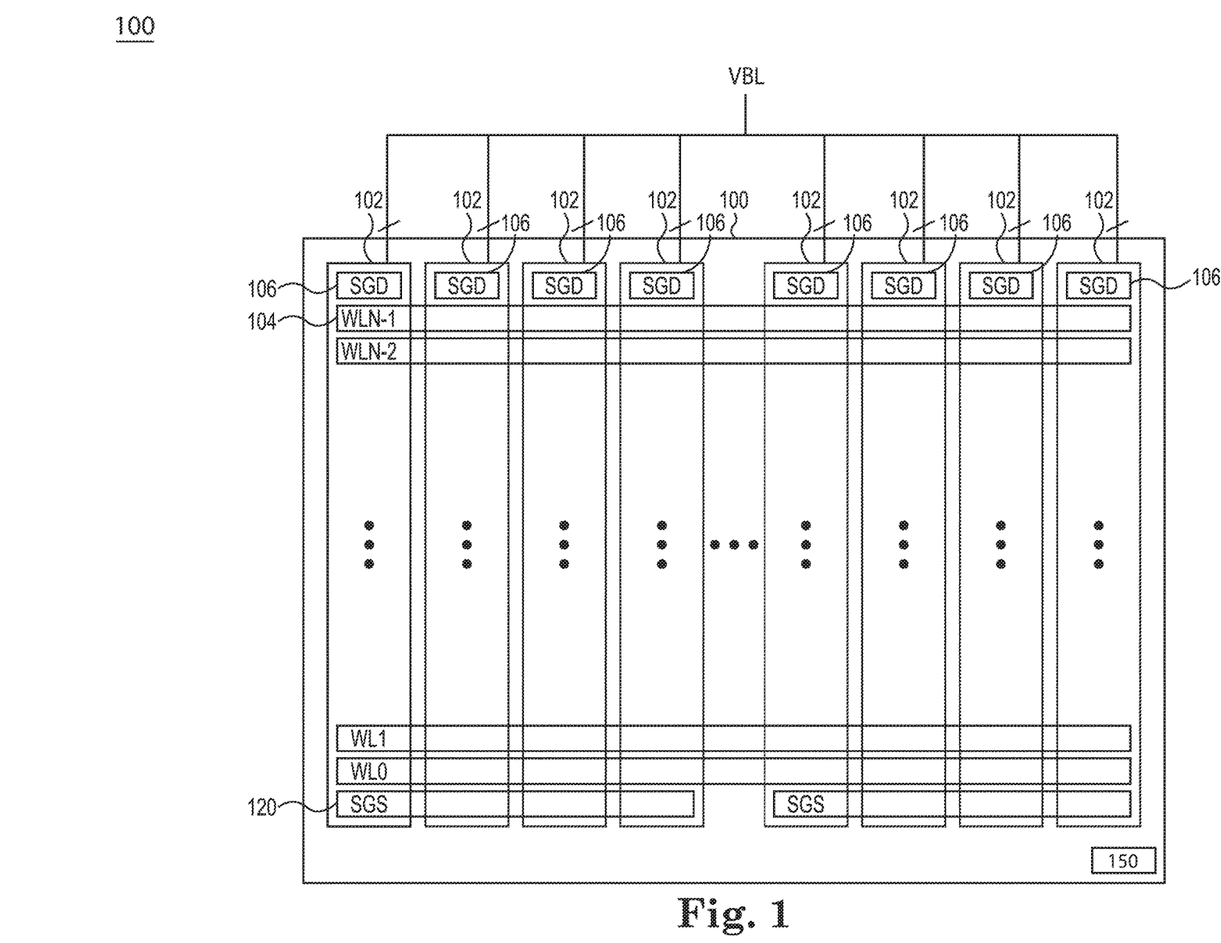
FIG. 1 is a schematic block diagram of an apparatus including a memory block according to an embodiment of the present invention.

FIG. 1 is a block diagram of an apparatus that includes a memory block 100 according to an embodiment of the present invention. As used herein, apparatus may refer to, for example, an integrated circuit, a memory device, a memory system, an electronic device or system, a smart phone, a tablet, a computer, a server, etc. The memory block 100 includes a plurality of memory subblocks 102, a plurality of memory access lines 104, a plurality of select gate drain (SGD) control lines 106, a plurality of select gate source (SGS) control lines 120, and control unit 150. Each of the SGD control lines 106 may be associated with a respective memory subblock 102 and each of the SGS control lines 120 may be associated with a respective plurality of memory subblocks 102.

In some examples, each of the memory subblocks 102 may include a plurality of memory cells, such as non-volatile memory cells (e.g., NAND memory cells) that may be arranged in rows and/or columns. In some examples, each of the memory cells may be a single-level cell (SLC) and/or may be a multi-level cell (MLC). In this manner, each memory cell may be programmed to distinct voltage states, each of which may correspond to a particular representation of binary data (e.g., single bit data 0, 1, multi-bit data 00, 01, 10, 11). Because each plurality of memory cells may include NAND memory cells, each plurality of memory cells may be implemented using one or more NAND strings within each memory subblock 102. Each string may, for instance, include 32 non-volatile memory cells, or may include a greater or lesser number of memory cells, and memory cells of each string may share a common channel. Each memory subblock 102 may include any number of strings.

With reference to FIGS. 3*a*-3*e*, each string may include a select gate drain (SGD) switch located at a first end of the string and a select gate source (SGS) switch located at a second end of the string opposite the first end. The SGD switch and the SGS switch may be implemented as transistors, as shown in the embodiments of FIGS. 3*a*-3*e*. The memory cells of the string may be coupled in a series configuration between the SGD switch and the SGS switch. Each of the memory cells of the string may be coupled to a respective memory access line WL that may be used to access the memory cell. Memory access line drivers may provide various voltages to the memory access lines during memory operations, for example, during program operations, read operations, erase operations, as well as other memory operations.

In some examples, an SGD switch may be configured to selectively couple a string to a signal line VBL and an SGS switch may be configured to selectively couple a string to a source (e.g., source line) SRC. By way of example, an SGD switch of a string included in a memory subblock 102 may be coupled to a respective SGD control line 106 associated with the memory subblock 102. Providing (e.g., asserting) a control signal (e.g., active control signal) on the SGD control line 106 may enable the respective SGD switch, thereby coupling the associated string to the signal litre VBL. An SGD control line 106 providing a control signal to enable the SGD switch in this manner is described herein as an "active" SGD control line 106. Similarly, an SGS switch of a memory subblock 102 may be coupled to an SGS line 120 associated with the memory subblock 102. Providing a control signal on the SGS line 120 may enable the SGS switch, thereby coupling the respective string to the source.

An SGS control line 120 providing a control signal to enable the SGS switch in this manner is described herein as an "active" SGS control line 120. Providing (e.g., deasserting) a control signal (e.g., inactive control signal) on the SGD control line 106 may disable the respective SGD switch, thereby decoupling the associated string from the signal line VBL. An SGD control line 106 providing a control signal to disable the SGD switch in this manner is described herein as an "inactive" SGD control line 106. Similarly, an SGS switch of a memory subblock 102 may be decoupled from an SGS line 120 associated with the memory subblock 102. Providing a control signal on the SGS line 120 may disable the SGS switch, thereby decoupling the respective string to the source. An SGS control line 120 providing a control signal to disable the SGS switch in this manner is described herein as an "inactive" SGS control line 120.

In some examples, control signals provided on respective SGD control lines 106 and SGS control lines 120, respectively, may be provided by control unit 150. The control unit 150 may be coupled to each of the SGD control lines 106 and the SGS control lines 120 and further may be configured to provide control signals to perform respective memory operations, described herein. The control unit 150 may be implemented in software and/or hardware, and may include any circuitry and/or logic required to perform operations. In some examples, the control unit 150 may be included in the block 100 and in other examples, the control unit 150 may be located outside of the block 100, for instance, in a row decoder, an address decoder, control logic coupled to the block 100 and/or a controller (not shown in FIG. 1). In this manner, one or more portions of the circuitry and/or logic of the control unit 150 may be employed in a distributed configuration.

Each SGD control line 106 may be associated with a respective memory subblock 102 of the block 100, each memory access line 104 may be associated with all memory subblocks 102 of the block 100, and/or each SGS control line 120 may be associated with a respective plurality of memory subblocks 102 of the block 100. Accordingly, each SGD control line 106 may be included, at least in part, in a respective memory subblock 102 and may be coupled to the SGD switch of the corresponding memory subblock 102. In this manner, each active SGD control line 106 may couple the string or strings of a respective memory subblock 102 to a set of signal lines shared, for instance, by each memory subblock 102. A memory access line 104 may be coupled to a memory cell of a string in each memory subblock 102 of the block 100. As a result, a memory access line 104 may span across all memory subblocks 102 of the block 100 and may be coupled to each memory cell of a particular row of memory cells. Each SGS control line 120 may span across an associated plurality of memory subblocks 102 and may be coupled to the SGS switches of the associated memory subblocks 102. In this manner, an active SGS control line 120 may couple strings of the associated plurality of memory subblocks 102 to a source SRC. In some examples, SGD control lines 106 and/or SGS control lines 120 may span memory subblocks 102 in a same direction as memory access lines 104 such that the SGD control lines 106, memory access lines 104, and/or SGS control lines 120 are substantially parallel. In other examples, SGD control lines 106, and/or SGS control lines 120 may span memory subblocks in an orthogonal direction or other non-parallel directions relative to memory access lines 104. SGD and SGS control lines 106, 120 may, for instance, be substantially parallel to one or more signal lines.

Because each SGS control line 120 may be associated with a respective plurality of memory subblocks 102, SGS switches coupled to an active SGS control line 120 may be enabled while SGS switches coupled to an inactive SGS control line 120 may be disabled. As will be explained in more detail below, by selectively enabling SGS switches in this manner, capacitive loading during one or more memory operations (e.g., read operations) may be reduced.

In some examples, any ratio of SGD control lines 106 to SGS control lines 120 and/or any ratio of memory access lines 104 to SGS control lines 120 may be achieved. By way of example, the block 100 may include 32 memory subblocks 102 and each SGS control line 120 may be coupled to the SGS switches of strings for 4 Memory subblocks 102 of the block 100. Accordingly, a 4:1 ratio of SGD control lines 106 to SGS control lines 120 and a 1:8 ratio of memory access lines 104 to SGS control lines 120 may be achieved. In other examples, each SGS control line 120 may be coupled to the SGS switches of strings for 2, 8, 16, 32, 64, or any other number of memory subblocks 102. It will be appreciated that in some examples, each SGS control line 120 may be coupled to the SGS switches of strings for a same number of memory subblocks 102, and that in other examples, SGS control lines 120 may be coupled to the SGS switches of strings for differing numbers of memory subblocks 102. A first SGS control line 120, for instance, may be coupled to the SGS switches of strings for 8 memory subblocks and a second SGS control line 120 may be coupled to the SGS switches of strings for 16 memory subblocks 120.

Generally, memory operations (e.g., read operations, program operations, erase operations) may be performed on one or more selected memory subblocks 102 while all other memory subblocks 102 may be unselected. Performing a memory operation on one or more selected memory subblocks 102 may include selectively enabling SGD switches, SGS switches, and/or memory cells. Description of memory operations is made herein with respect to individual memory subblocks 102. It will be appreciated, however, that in some examples, one or more described operations may be applied simultaneously to any number of memory subblocks 102. Moreover, reference is made herein to selectively enabling SGD and SGS switches to perform memory operations. As described, SGD and SGS switches may be enabled by providing control signal on SGD control lines 106 or SGS control lines 120, respectively, and control signals provided in this manner may be provided by the control unit 150.

In an erase operation, for example, SGD and SGS switches may be disabled. For each row, a low voltage, such as ground potential (e.g., 0V), may be applied to the memory access line 104 associated with the row, thereby erasing the voltage state of each memory cell. In some examples, erase operations may be implemented at a block level and accordingly one or more memory subblocks 102 may be erased simultaneously. As a result, all SGD lines 106 and all SGS lines 120 may have a low voltage during an erase operation to disable the SGD and SGS switches.

Typically, program operations are performed on erased memory cells, and as a result, only memory cells of a memory subblock 102 intended to be adjusted from an erased voltage state to a different voltage state need be programmed. In an example programming operation, one or more selected rows of a memory subblock 102 may be programmed sequentially. By way of example, for each selected row, signal lines associated with a cell to be programmed may be precharged to a first voltage (e.g., 0-1V) and signal lines associated with a cell not to be programmed may be precharged to a second voltage (2-3V) that may for instance, be higher than the first precharge voltage. A relatively high voltage (e.g., 15V) may be applied to a memory access line 104 corresponding to the row being programmed, while an intermediate voltage (e.g., 8V) may be applied to all other memory access lines 104. A magnitude of the intermediate voltage may be greater than a voltage of the voltage state having a highest magnitude to ensure that all memory cells of the memory subblock 102 are conductive. Thereafter, an SGD control line 106 associated with the selected memory subblock 102 may become active and SGD switches associated with strings to be programmed may be selectively enabled (while SGS switches may remain disabled) to program cells of the row. Because signal lines associated with cells not to be programmed have a higher precharge voltage, SGD switches associated with those signal lines may remain disabled and prevent programming of respective cells. In some examples, the relatively high voltage applied to the memory access line 104 may be incrementally increased until each selected cell of the target row achieves a desired voltage level. During the programming operation, SGD and SGS switches of unselected memory subblocks 102 may be disabled.

In an example read operation, selected signal lines may be precharged to a voltage (e.g., 0.3V), and both the SGD and SGS switches of a memory subblock 102 may be enabled. Because each SGS control line 120 may be associated with a respective plurality of memory subblocks 102, SGS switches of one or more other memory subblocks 102 associated with the same SGS control line 120 may be enabled as well. Thereafter, a relatively low voltage (e.g., 0-2V) may be applied to a memory access line 104 associated with the row to be read, while an intermediate voltage (e.g., 8V) may be applied to all other memory access lines 104. In some examples, the relatively low voltage may be a voltage having a magnitude between voltage levels of particular voltage states. Further, as described, a magnitude of the intermediate voltage may be greater than a voltage of the voltage state having a highest magnitude to ensure that all memory cells of the memory subblock 102 are conductive. The SGD switches may be disabled (e.g., to electrically isolate selected signal lines), and the voltage of each selected signal line may be used to determine the voltage state of selected memory cells of the row. In some examples, the voltage of each selected signal line may be sensed to determine the voltage state of selected memory cells of the row prior to disabling the SGD switches. During the read operation, SGD switches of unselected memory subblocks 102 may be disabled, and SGS switches of all memory subblocks 102 not associated with the active SGS line 120 of the read operation may be disabled. In this manner, only the respective plurality of memory subblocks 102 associated with an active SGS line 120 may have enabled SGS switches. All other memory subblocks 102 may be associated with an inactive SGS line 120 and accordingly may have disabled SGS switches.

Figure 2:
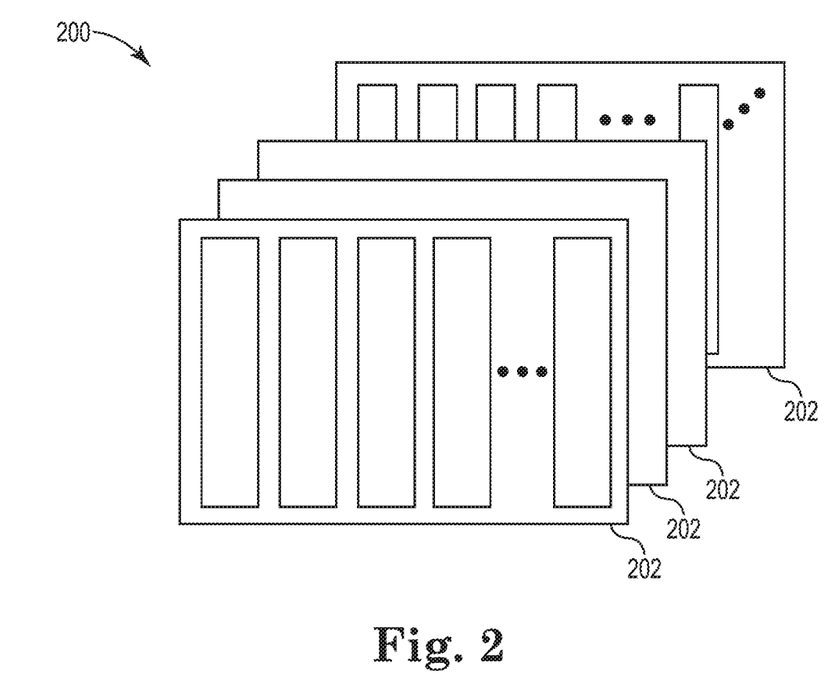
FIG. 2 is a block diagram of a three-dimensional memory array according to an embodiment of the present invention.

In some examples, the block 100 may be implemented in a three-dimensional arrangement. FIG. 2 is a block diagram of a three-dimensional memory array 200 according to an embodiment of the present invention. The three-dimensional memory array 200 may include any number of blocks 202, one or more of which may be implemented using the block 100 of FIG. 1. By way of example, the three-dimensional memory array 200 may include 32 blocks 202, or may include 64 blocks 202. In some examples, memory cells of each block 202 may be accessed concurrently, simultaneously, and/or in an otherwise overlapping manner such that data may be read from, programmed to, and/or erased from multiple blocks 202 in accordance with one or more memory operations. In other examples, the blocks 202 may be configured to share one or more components, such as signal lines and/or control lines.

Figure 3A:
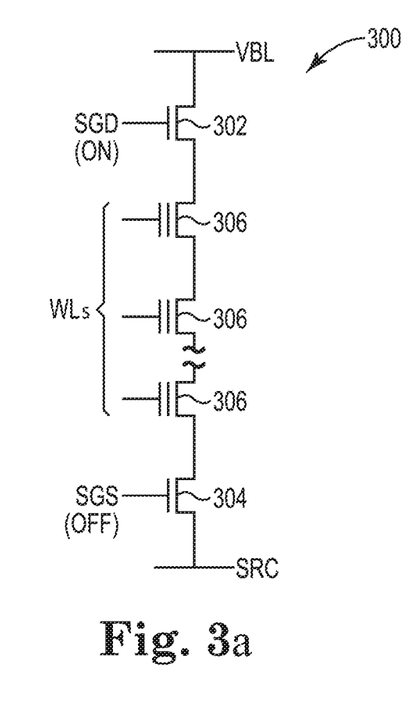
FIG. 3*a* is a schematic diagram of a NAND string of a selected subblock during a program operation according to an embodiment of the present invention.
Figure 3B:
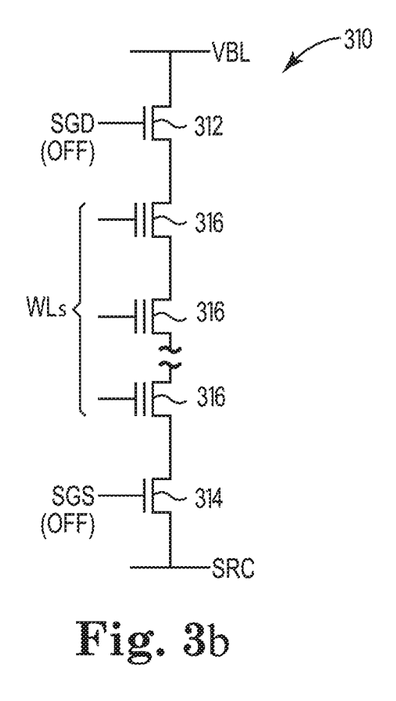
FIG. 3*b* is a schematic diagram of a NAND string of an unselected subblock during a program operation according to an embodiment of the present invention.
Figure 3C:
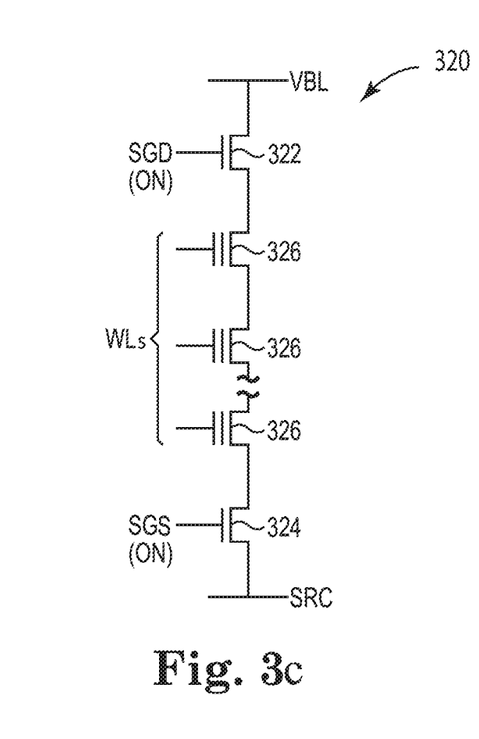
FIG. 3*c* is a schematic diagram of a NAND string of a selected subblock during a read operation according to an embodiment of the present invention.
Figure 3D:
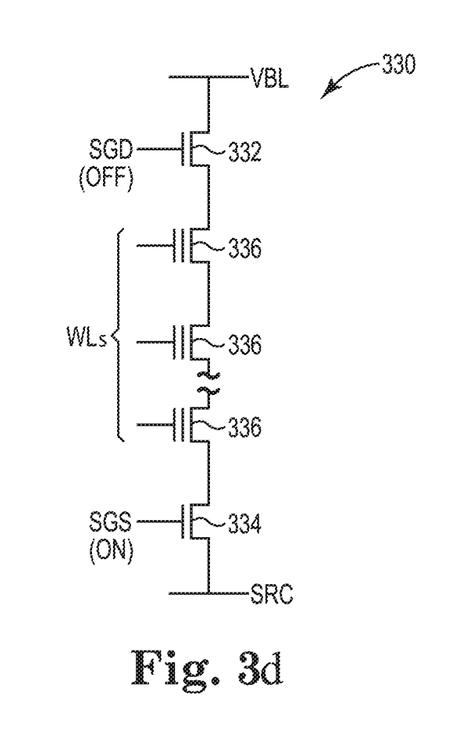
FIG. 3*d* is a schematic diagram of a NAND string of an unselected subblock during a read operation according to an embodiment of the present invention.
Figure 3E:
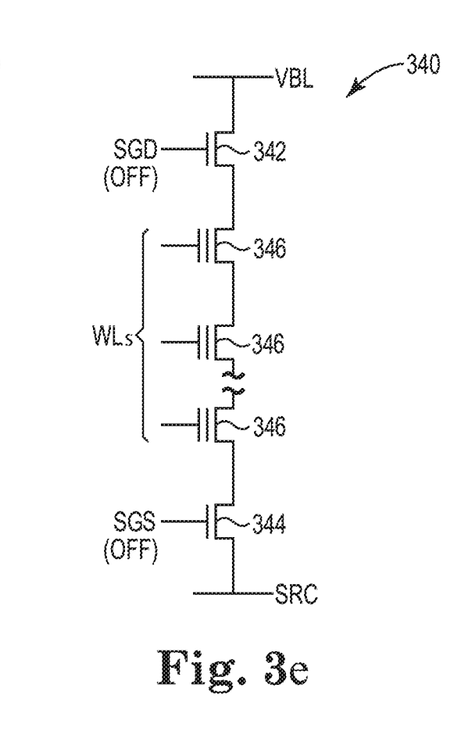
FIG. 3*e* is a schematic diagram of a NAND string of an unselected subblock during a read operation according to an embodiment of the present invention.

FIGS. 3a-3b illustrate schematic diagrams of NAND strings 300-310 during a program operation and FIGS. 3c-3e illustrate schematic diagrams of NAND strings 320-340 during a read operation. The NAND strings 300-340 may include respective SGD switches 302-342, respective SGS switches 304-344, and respective memory cells 306-346. As described, each SGD switch may be located at a first end of a NAND string and may be configured to selectively couple the NAND string to a signal line VBL responsive to assertion of a control signal provided to an SGD switch. The control signal may be provided, for instance, on an SGD control line coupled to an SGD switch 302, such as an SGD control line 106 of FIG. 1. Similarly, each SGS switch may be located at a second end of the NAND string and may be configured to selectively couple the NAND string to a source SRC responsive to assertion of a control signal provided to an SGS switch. The control signal may be provided, for instance, on an SGS control line coupled to a SGS switch, such as an SGS control line 120 of FIG. 1. Each of the memory cells may be coupled in a series configuration between respective SGD and SGS switches.

FIG. 3a is a schematic diagram of a NAND string 300 of a selected memory subblock during a program operation according to an embodiment of the present invention. As described, during the program operation, the SGD switch 302 may be enabled and the SGS switch 304 may be disabled. As a result, during a program operation, each cell 306 may provide (e.g., generate) a capacitive load between a gate of the cell 306 and the signal line VBL.

FIG. 3b is a schematic diagram of a NAND string 310 of an unselected memory subblock during a program operation according to an embodiment of the present invention. As described, during the program operation, the SGD switch 312 and the SGS switch 314 may be disabled. In this manner, voltage levels of the string may float. As a result, during the program operation, each cell 316 may provide a capacitive load between a gate of the cell 316 and the source SRC. The capacitive load, however, may be in series with a junction capacitance of the SGS switch 314. Because the capacitive load provided by cells 316 of the NAND string 310 may be in series with junction capacitance of the SGS switch 314, the capacitive load provided by the NAND string 300 may exceed the capacitive load provided by the NAND string 310 during program operations.

FIG. 3c is a schematic diagram of a NAND string 320 of a selected memory subblock during a read operation according to an embodiment of the present invention. As described, during the read operation, both the SGD switch 322 and the SGS switch 324 may be enabled simultaneously. As a result, each of the cells 326 may provide a load between a gate of the cell 326 and the source SRC. The load may include a capacitive load and a resistive load. The resistive load may include a channel resistance of the NAND string 320.

FIG. 3d is a schematic diagram of a NAND string 330 of an unselected memory subblock during a read operation according to an embodiment of the present invention. The NAND string 330, while included in an unselected memory subblock, may, for instance, be associated with a same SGS control line 120 as the NAND string 320 of FIG. 3c. Accordingly, during a read operation, the NAND string 330 may be associated with an active SGS control line 120 and have an enabled SGS switch 334. As a result, during the read operation, each cell 336 may provide a capacitive load between a gate of the cell 336 and the source SRC.

FIG. 3e is a schematic diagram of a NAND string 340 of an unselected memory subblock during a read operation according to an embodiment of the present invention. In contrast to the NAND string 330 of FIG. 3d, the NAND string 340 may not be associated with a same SGS control line as the selected NAND string 320 of FIG. 3c. Accordingly, during the read operation, the NAND string 340 may be associated with an inactive SGS control line 120 and the SGS switch 344 may be disabled. As a result, each cell 346 may provide a capacitive load between a gate of the cell 346 and the source SRC. The capacitive load, however, may be in series with a junction capacitance of the SGS switch 344. Because the capacitive load provided by cells 346 of the NAND string 340 may be in series with junction capacitance of the SGS switch 344, the capacitive load provided by the NAND string 330 may exceed the capacitive load provided by the NAND string 340 during read operations.

With reference to FIG. 1, by reducing the number of memory subblocks 102 having enabled SGS switches during a read operation (e.g., less than all memory subblocks 102 of the block 100), the overall capacitive load of the block 100 may be reduced during the read operation. In this manner, design constraints may be relaxed and/or performance may be improved. By way of example, capacitive loads driven by memory access line drivers (not shown), may be reduced such that a smaller charge pump may be required for operation and/or memory access line voltages transition more quickly during operation.

Figure 4:
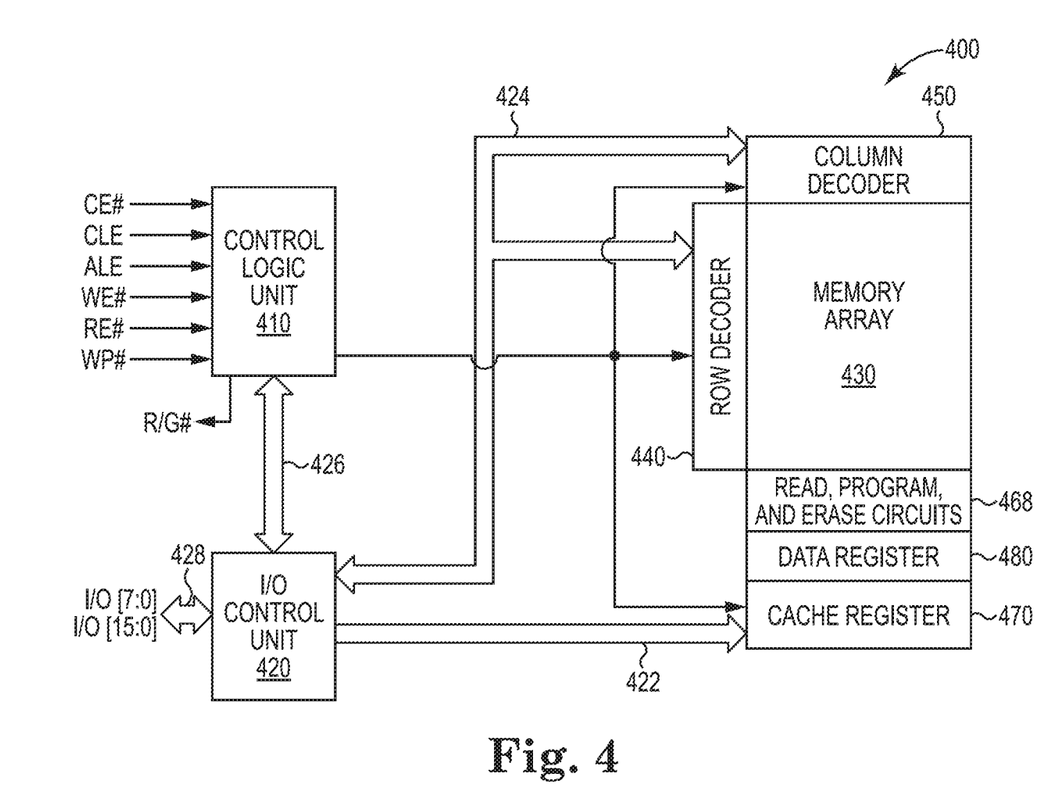
FIG. 4 is a block diagram of a memory according to an embodiment of the present invention.

FIG. 4 illustrates a memory 400 according to an embodiment of the present invention. The memory 400 includes a memory array 430 with a plurality of memory cells. The memory cells may be non-volatile memory cells, such as NAND flash cells, or may generally be any type of memory cells. In some examples, the memory array 430 may include one or more memory blocks, such as a memory block 100 of FIG. 1. Moreover, the memory array 430 may be implemented as a three-dimensional memory array, such as the three-dimensional memory array 200 of FIG. 2.

Command signals, address signals, and write data signals may be provided to the memory 400 as sets of sequential input/output ("I/O") signals transmitted through an I/O bus 428. Similarly, read data signals may be provided from the memory 400 through the I/O bus 428. The I/O bus 428 is connected to an I/O control unit 420 that routes the signals between the I/O bus 428 and an internal data bus 422, an internal address bus 424, and an internal command bus 426. The memory 400 also includes a control logic unit 410 that receives a number of control signals either externally or through the internal command bus 426 to control the operation of the memory 400.

The internal address bus 424 applies block-row and/or subblock-row address signals to a row decoder 440 and column address signals to a column decoder 450. The row decoder 440 and column decoder 450 may be used to select blocks of memory or memory cells for memory operations, for example, read, program, and erase operations. The column decoder 450 may enable write data signals to be applied to columns of memory corresponding to the column address signals and allow read data signals to be coupled from columns corresponding to the column address signals.

In response to the memory commands decoded by the control logic unit 410, the memory cells in the memory array 430 are read, programmed, and/or erased. Read, program, erase circuits 468 coupled to the memory array 430 receive control signals from the control logic unit 410 and include voltage generators (e.g., charge pumps) for generating various pumped voltages for read, program and erase operations.

After the row address signals have been applied to the internal address bus 424, the I/O control unit 420 routes write data signals to a cache register 470. The write data signals are stored in the cache register 470 in successive sets each having a size corresponding to the width of the I/O bus 428. The cache register 470 sequentially stores the sets of write data signals for an entire row or page of memory cells in the memory array 430. All of the stored write data signals are then used to program a row or page of memory cells in the memory array 430 selected by the block-row address or subblock-row address coupled through the internal address bus 424. In a similar manner, during a read operation, data signals from a row or block of memory cells selected by the block-row address coupled through the internal address bus 424 are stored in a data register 480. Sets of data signals corresponding in size to the width of the I/O bus 428 are then sequentially transferred through the I/O control unit 420 from the data register 480 to the I/O bus 428.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
a first plurality of memory subblocks;
a first select gate source control line associated with the first plurality of memory subblocks;
a second plurality of memory subblocks;
a second select gate source control line associated with the second plurality of memory subblocks;
a plurality of source gate drain control lines each associated with a respective memory subblock of the first plurality of memory subblocks;
a memory subblock of the first plurality of memory subblocks including a first plurality of select gate source switches, each select gate source switch of the first plurality of select gate source switches coupled to the first select gate source control line, the memory subblock of the first plurality of memory subblocks further including a plurality of select gate drain switches, each select gate drain switch of the first plurality of select gate drain switches coupled to a source gate drain control line of the plurality of source gate drain control lines;
a memory subblock of the second plurality of memory subblocks including a second plurality of select gate source switches, each select gate source switch of the second plurality of select gate source switches coupled to the second select gate source control line; and
a control unit coupled to the first and second select gate source control lines, wherein during a read operation associated with the memory subblock of the first plurality of memory subblocks, the control unit is configured to:
provide a first control signal on the first select gate source control line to enable the select gate source switches of the memory subblock of the first plurality of memory subblocks;
provide a second control signal on the second select gate source control line to disable the select gate source switches of the memory subblock of the second plurality of memory subblocks;

provide a third control signal on a first select gate drain control line of the plurality of source gate drain control lines to enable the select gate drain switches of the memory subblock of the first plurality of memory subblocks; and provide a fourth control signal on a second select gate drain control line of the plurality of source gate drain control lines to disable select gate drain switches of remaining memory subblocks of the first plurality of memory subblocks.

2. The apparatus of claim 1, wherein during a read operation associated with the memory subblock of the second plurality of memory subblocks, the control unit is further configured to:

provide a fifth control signal on the second select gate source control line to enable the select gate source switches of the memory subblock of the second plurality of memory subblocks; and provide a sixth control signal on the first select gate source control line to disable the select gate source switches of the memory subblock of the first plurality of memory subblocks.

3. The apparatus of claim 1, wherein the memory subblock of the first plurality of memory subblocks comprises a string.

4. The apparatus of claim 3, wherein the first control signal is configured to couple the string to a source.

5. The apparatus of claim 3, wherein the string comprises a NAND string.

6. The apparatus of claim 1, wherein the first plurality of memory subblocks includes a first number of memory subblocks and the second plurality of memory subblocks includes a second number of memory subblocks greater than the first number of memory subblocks.

7. The apparatus of claim 1, further comprising an input-output control unit configured to receive data from and provide data to the first plurality of memory subblocks and the second plurality of memory subblocks.

8. The apparatus of claim 1, further comprising a plurality of word lines, wherein individual ones of the plurality of word lines are associated with all of the first plurality of memory subblocks.

9. The apparatus of claim 1, further comprising a plurality of word lines, wherein individual ones of the plurality of word lines are associated with all of the second plurality of memory subblocks.

10. An apparatus comprising:
a plurality of select gate source control lines;
a plurality of select gate drain control lines;
a memory block comprising:
  a plurality of memory access lines; and
  a plurality of memory subblocks including a plurality of select gate source switches and a plurality of select gate drain switches,
wherein each select gate source control line of the plurality of select gate source control lines is parallel to at least one of the plurality of memory access lines of the memory block and each select gate source control line of the plurality of select gate source control lines is associated with a respective plurality of memory subblocks of the plurality of memory subblocks of the memory block, and
wherein each select gate drain control line of the plurality of select gate drain control lines is parallel to at least one of the plurality of memory access lines of the memory block and each select gate drain control line of the plurality of select gate drain control lines is associated with a respective memory subblock of the respective plurality of memory subblocks associated with a select gate source control line of the plurality of select gate source control lines; and a control unit configured to, during a read operation:
selectively provide a respective control signal on each select gate source control line of the plurality of select gate source control lines to enable the select gate source switches of the plurality of memory subblocks of the block; and selectively provide a respective control signal on each select gate drain control line of the plurality of select gate drain control lines to enable the select gate drain switches of the respective memory subblock of the plurality of memory subblocks of the block during the read operation.

11. The apparatus of claim 10, wherein the control unit is further configured to, during the read operation, provide the respective control signal on at least one select gate source control line of the plurality of select gate source control lines to disable select gate source switches of memory subblocks of the plurality of memory subblocks associated with the at least one select gate source control line.

12. The apparatus of claim 11, wherein providing the respective control signal on the at least one select gate source control line of the plurality of select gate source control lines is configured to disable select gate source switches of memory subblocks of the plurality of memory subblocks associated with the at least one select gate source control line, wherein the disabled select gate source switches cause coupling of each capacitive load of a plurality of capacitive loads in series with a junction capacitance.

13. The apparatus of claim 12, wherein a capacitance of the plurality of capacitive loads and the junction capacitance during the read operation is greater than a capacitance during a program operation.

14. The apparatus of claim 10, wherein each subblock of the plurality of subblocks comprises a NAND string comprising a plurality of cells.

15. The apparatus of claim 14, wherein a select gate source switch of the plurality of select gate source switches is located at a first end of the NAND string and a select gate drain switch of the plurality of select gate drain switches is located at a second end of the NAND string.

16. An apparatus comprising:
a plurality of signal lines;
a source line;
first, second, and third select gate drain lines;
first and second select gate source lines;
first, second, and third memory subblocks each comprising a plurality of memory cells, wherein the first and second memory subblocks are coupled to the first select gate source line and the third memory subblock is coupled to the second select gate source line, and wherein the first memory subblock is coupled to the first select gate drain line, the second memory subblock is coupled to the second select gate drain line, and the third memory subblock is coupled to the third select gate drain line;
a memory access line coupled to memory cells of the plurality of memory cells of the first, second, and third memory subblocks; and
a control unit configured, during a program operation, to:
selectively activate the first and second select gate drain lines to couple the first and second memory subblocks to a first signal line of the plurality of signal lines;

selectively deactivate the first select gate source line to decouple the source line from the first and second memory subblocks;

selectively activate the second select gate source line to couple the third memory subblock to the source line; and provide a voltage to the memory access line.

17. The apparatus of claim 16, wherein the control unit is configured to cause a capacitive load between a gate of a memory cell of the plurality of memory cells coupled to the first select gate drain line and the first signal line during the program operation.

18. The apparatus of claim 16, wherein the apparatus is included in a three-dimensional memory array.

19. The apparatus of claim 16, wherein the memory access line is parallel to the select gate source lines.

20. The apparatus of claim 16, Wherein the plurality of memory cells comprise a plurality of NAND strings.

* * * * *